(12) United States Patent
Yamagata

(10) Patent No.: US 9,600,609 B2
(45) Date of Patent: Mar. 21, 2017

(54) MOVING STATE CALCULATING METHOD AND MOVING STATE CALCULATING DEVICE

(71) Applicant: Seiko Epson Corporation, Tokyo (JP)

(72) Inventor: Yoshitaka Yamagata, Matsumoto (JP)

(73) Assignee: Seiko Epson Corporation (JP)

( * ) Notice: Subject to any disclaimer, the term of this patent is extended or adjusted under 35 U.S.C. 154(b) by 741 days.

(21) Appl. No.: 13/975,766

(22) Filed: Aug. 26, 2013

(65) Prior Publication Data

US 2014/0067343 A1 Mar. 6, 2014

(30) Foreign Application Priority Data

Sep. 3, 2012 (JP) ................................. 2012-193170

(51) Int. Cl.
| | | |
|---|---|---|
| G06F 17/50 | (2006.01) | |
| G05D 1/02 | (2006.01) | |
| G06F 17/10 | (2006.01) | |
| G06F 17/18 | (2006.01) | |
| G06F 17/11 | (2006.01) | |
| G05B 17/02 | (2006.01) | |

(52) U.S. Cl.
CPC ....... G06F 17/5009 (2013.01); G05D 1/0278 (2013.01)

(58) Field of Classification Search
CPC ...... G06F 2217/16; G06F 17/10; G06F 17/18; G06F 17/11
USPC .......................................................... 703/2
See application file for complete search history.

(56) References Cited

U.S. PATENT DOCUMENTS

| | | | |
|---|---|---|---|
| 8,358,241 B2 | 1/2013 | Yoshioka | |
| 2003/0216865 A1* | 11/2003 | Riewe | G01S 19/47 |
| | | | 701/470 |
| 2007/0239347 A1 | 10/2007 | Watanabe et al. | |

FOREIGN PATENT DOCUMENTS

| | | |
|---|---|---|
| JP | 2000-002759 A | 1/2000 |
| JP | 2004-150852 A | 5/2004 |
| JP | 2005-331392 A | 12/2005 |
| JP | 2006-138835 A | 6/2006 |
| JP | 2010-266468 | 11/2010 |

OTHER PUBLICATIONS

Williams et al. "Airborne Four-Dimensional Flight Management in a Time-Based Air Traffic Control Environment", NASA Technical Memorandum 4249, Mar. 1991, pp. 1-33.*

* cited by examiner

Primary Examiner — Omar Fernandez Rivas
Assistant Examiner — Shiuh-Huei Ku
(74) Attorney, Agent, or Firm — Harness, Dickey & Pierce, P.L.C.

(57) ABSTRACT

A first moving state at a given time including any of a position, a velocity, and a moving direction of a moving object moving in a space is estimated. A constraint condition for calculating a second moving state at the given time is set using the first moving state and a previously-calculated second moving state including any of a position, a velocity, and a moving direction of the moving object moving in the space. The first moving state is corrected using the constraint condition to calculate the second moving state at the given time.

2 Claims, 6 Drawing Sheets

$$\theta_{ave} = \frac{\theta_{k-3} + \theta_{k-2} + \theta_{k-1}}{3}$$

$$g_k(\vec{v}_k) = \theta_k - \theta_{ave} = \Delta\theta_k$$

$$d_k = 0$$

MOVING STATE CALCULATING METHOD AND MOVING STATE CALCULATING DEVICE

CROSS-REFERENCE

This application claims priority to Japanese Patent Application No. 2012-193170, filed Sep. 3, 2012, the entirety of which is hereby incorporated by reference.

BACKGROUND

1. Technical Field

The present invention relates to a method of calculating a moving state of a moving object and the like.

2. Related Art

Techniques of estimating moving states including quantities such as a position, a velocity, and a moving direction of a moving object moving in a movement space using a state estimating technique in a state space have been invented. The Kalman filter is widely known as the state estimating technique. For example, JP-A-2010-266468 discloses a technique of estimating a position of a moving object using the Kalman filter.

In the estimation of a moving state using the Kalman filter, a moving state of a moving object changing from time to time is sequentially estimated using observation information including an error. Reference information detected, for example, by an external sensor (a sensor such as a global positioning system (GPS) sensor, an inertial sensor, or a geometric sensor, which is hereinafter comprehensively referred to as a "reference sensor") is used as the observation information.

However, the above-mentioned techniques have a problem in that estimation accuracy of a moving state depends on only detection accuracy of the reference sensor. That is, when the detection accuracy of the reference sensor is low, inaccurate reference information is used as the observation information for calculation of the Kalman filter and thus there is a problem in that accuracy of the estimated moving state is lowered due to inclination to the observation information.

SUMMARY

An advantage of some aspects of the invention is that it provides a new technique of correctly calculating a moving state of a moving object.

A first aspect of the invention is directed to a moving state calculating method including: estimating a first moving state at a given time including any of a position, a velocity, and a moving direction of a moving object moving in a space; setting a constraint condition for calculating a second moving state at the given time using the first moving state and a previously-calculated second moving state including any of a position, a velocity, and a moving direction of the moving object moving in the space; and correcting the first moving state using the constraint condition to calculate the second moving state at the given time.

As another aspect of the invention, the aspect of the invention may be configured as a moving state calculating device including: an estimation unit that estimates a first moving state at a given time including any of a position, a velocity, and a moving direction of a moving object moving in a space; a setting unit that sets a constraint condition for calculating a second moving state at the given time using the first moving state and a previously-calculated second moving state including any of a position, a velocity, and a moving direction of the moving object moving in the space; and a correction unit that corrects the first moving state using the constraint condition to calculate the second moving state at the given time.

According to the first aspect and the like, a first moving state at a given time including any of a position, a velocity, and a moving direction of a moving object moving in a movement space (space) is estimated. A constraint condition for calculating a second moving state at the given time is set using the first moving state and a previously-calculated second moving state including any of a position, a velocity, and a moving direction of the moving object moving in the movement space. The first moving state is corrected using the constraint condition to calculate the second moving state at the given time. The estimating of the first moving state can be implemented by the use of a known state estimating technique (for example, Kalman filter). The second moving state (new second moving state) at the given time is calculated by correcting the first moving state at the given time using a predetermined constraint condition as well as performing the estimation of the first moving state. As a result, it is possible to correctly calculate the moving state of the moving state.

As a second aspect of the invention, the moving state calculating method according to the first aspect may be configured such that the setting of the constraint condition includes setting the constraint condition so as to follow a state variation tendency of the previously-calculated second moving state.

According to the second aspect, the constraint condition is set to cause the first moving state to follow the tendency of the state variation of the previously-calculated second moving state.

As a third aspect of the invention, as the constraint condition of this case, for example, the constraint condition may be set to continue to rectilinearly move when the state variation of the previously-calculated second moving state indicates a rectilinear moving tendency.

According to the third aspect, it is possible to calculate the second moving state at the given time by correcting the first moving state to exhibit the rectilinear moving tendency.

As a fourth aspect of the invention, for example, the constraint condition may be set to continue to turn when the state variation of the previously-calculated second moving state indicates a turning tendency.

According to the fourth aspect, it is possible to calculate the second moving state at the given time by correcting the first moving state to exhibit the turning tendency.

as a fifth aspect of the invention, the moving state calculating method according to any of the second to fourth aspects may be configured such that the setting of the constraint condition includes calculating a parameter indicating a degree of adapting the first moving state to the tendency of the state variation of the previously-calculated second moving state, and the correcting of the first moving state includes causing the first moving state to get close to a state in which the constraint condition is satisfied using the parameter.

According to the fifth aspect, the parameter indicating a degree of adapting the first moving state to the tendency of the state variation of the previously-calculated second moving state is calculated. The first moving state is made to get close to a state where the constraint condition is satisfied using the parameter. Accordingly, it is possible to calculate the second moving state at the given time by appropriately correcting the first moving state.

as a sixth aspect of the invention of the invention, the moving state calculating method according to the fifth aspect may be configured such that the setting of the constraint condition includes determining a reference moving direction using the previously-calculated second moving state, and the calculating of the parameter includes calculating the parameter on the basis of a difference between the moving direction included in the first moving state and the reference moving direction.

According to the sixth aspect, the reference moving direction is determined using the previously-calculated second moving state. An appropriately value can be set as the parameter indicating the degree of adapting the first moving state to the tendency of the state variation of the previously-calculated second moving state on the basis of the difference between the moving direction included in the first moving state and the reference moving direction.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. Principle 1-1. General

Figure 1:
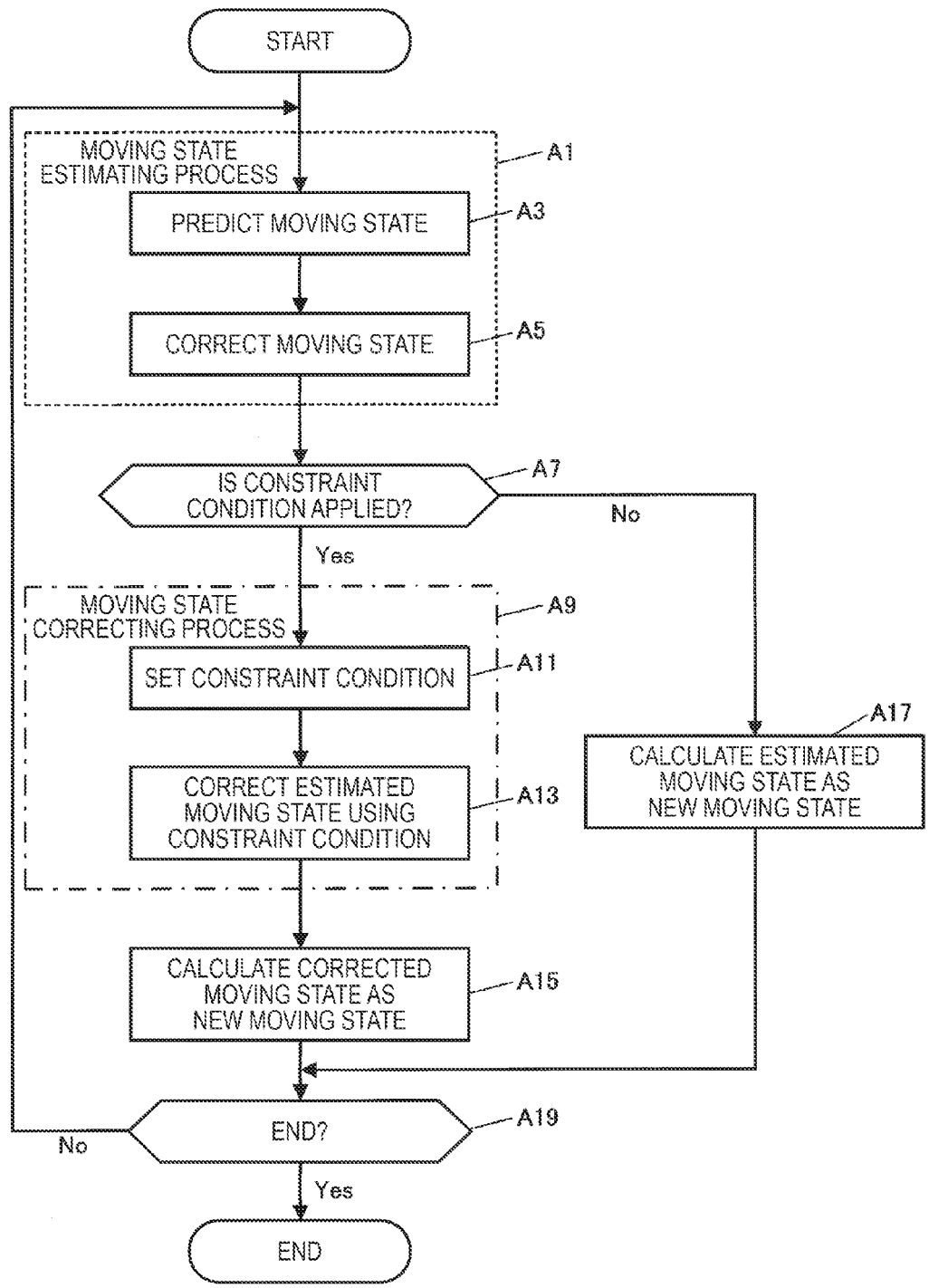
FIG. 1 is a flowchart illustrating a process flow of estimating a moving state.

First, parameters or the like will be defined. In this exemplary embodiment, a movement space of a moving object is defined as a state space. A moving state in the movement space is marked using "x" and a moving state at time "k" is marked by "$x_k$". An observation value is marked using "y" and the observation value acquired at time "k" is marked by "$y_k$". A set of observation values including the observation values up to time k is defined as an observation signal and is marked by "$Y_k = \{y_0, y_1, \ldots, y_k\}$".

When the state estimating technique known in the related art is used to estimate a moving state, the moving state is sequentially estimated by repeating prediction of the moving state and correction of the moving state. In the prediction of a moving state, a current moving state is predicted from a previously-estimated moving state. This means that the future is inferred from previous observation. The prediction of a moving state $x_k$ at time k can be expressed by Expression 1 using the conditional probability density function of the moving state $x_k$ when an observation signal $Y_{k-1} = \{y_0, y_1, \ldots, y_{k-1}\}$ up to time k-1 is given.

$$p(x_k|Y_{k-1}) = \int p(x_k|x_{k-1})p(x_{k-1}|Y_{k-1})dx_{k-1} \quad (1)$$

In the correction of a moving state, the predicted value acquired from the prediction of the moving state is corrected using a newly acquired observation value. Specifically, the moving state $x_k$ is corrected using the observation value $y_k$ newly acquired at time k. Since the observation value $y_k$ is acquired in a state where the observation signal $Y_{k-1} = \{y_0, y_1, \ldots, y_{k-1}\}$ is given already, the observation signal is changed to $Y_k = \{y_0, y_1, \ldots, y_k\}$. In this case, the correction of the moving state $x_k$ can be expressed by Expression 2 using the conditional probability density function of the moving state $x_k$ when the observation signal $Y_k$ is given.

$$p(x_k|Y_k) = \frac{p(y_k|x_k)p(x_k|Y_{k-1})}{\int p(y_k|x_k)p(x_k|Y_{k-1})dx_k} \quad (2)$$

The operation of estimating a moving state up to now is only application of the state estimating technique known in the related art. In this exemplary embodiment, a constraint condition for newly calculating a second moving state is set using the moving state (hereinafter, referred to as "first moving state") estimated by performing the operation of estimating a moving state and the previously-calculated moving state (hereinafter, referred to as "second moving state"). The first moving state is corrected using the set constraint condition, whereby the new second moving state is calculated. This is the most important feature of this exemplary embodiment.

In order to introduce the constraint condition, a parameter representing the constraint condition is introduced as a parameter of the conditional probability density function of the moving state $x_k$. Although details of the constraint condition will be described later, a parameter called constraint condition definition value "d" is introduced as a parameter necessary for defining the constraint condition. The constraint condition definition value at time "k" is marked by "$d_k$". A set of constraint condition definition values including the constraint condition definition values up to time k is referred to as a constraint condition signal and is marked by "$D_k = \{d_0, d_1, \ldots, d_k\}$".

FIG. 1 is a flowchart illustrating a process flow (moving state calculating method) of calculating a moving state in this exemplary embodiment.

First, a moving state estimating process is performed (step A1). In the moving state estimating process, as described above, two processes of the prediction of a moving state (step A3) and the correction of a moving state (step A5) are performed.

In step A3, the moving state x at the current time is predicted using the previously-calculated second moving state. Specifically, the prediction of the moving state $x_k$ at time k can be expressed by Expression 3 using the conditional probability density function of the moving state $x_k$ when the observation signal $Y_{k-1} = \{y_0, y_1, \ldots, y_{k-1}\}$ up to time k-1 and the constraint condition signal $D_{k-1} = \{d_0, d_1, \ldots, d_{k-1}\}$ up to time k-1 are given.

$$p(x_k|Y_{k-1}, D_{k-1}) = \int p(x_k|x_{k-1})p(x_{k-1}|Y_{k-1}, D_{k-1})dx_{k-1} \quad (3)$$

In step A5, the moving state $x_k$ predicted in step A3 is corrected using a newly acquired observation value $y_k$. By newly acquiring the observation value $y_k$ in a state where the observation signal $Y_{k-1} = \{y_0, y_1, \ldots, y_{k-1}\}$ up to time k−1 is given, the observation signal becomes observation signal $Y_k = \{y_0, y_1, \ldots, y_k\}$. In this case, the correction of the moving state $x_k$ can be expressed by Expression 4 using the conditional probability density function of the moving state $x_k$ when the observation signal $y_k$ and the constraint condition signal $D_{k-1}$ up to time k−1 are given.

$$p(x_k \mid Y_k, D_{k-1}) = \frac{p(y_k \mid x_k) p(x_k \mid Y_{k-1}, D_{k-1})}{\int p(y_k \mid x_k) p(x_k \mid Y_{k-1}, D_{k-1}) dx_k} \quad (4)$$

After the moving state estimating process of step A1 is performed, it is determined whether the constraint condition should be applied (step A7). When it is determined that the constraint condition should not be applied (NO in step A7), the moving state (first moving state) estimated through the moving state estimating process is calculated as a new moving state (second moving state) (step A17). Then, the process flow goes to step A19.

On the other hand, when it is determined that the constraint condition should be applied (YES in step A7), the moving state correcting process is performed (step A9). In the moving state correcting process, first, the constraint condition is set (step A11). By newly setting the constraint condition at time k in a state where the constraint condition signal $D_{k-1} = \{d_0, d_1, \ldots, d_{k-1}\}$ up to time k−1 is given, the constraint condition signal becomes $D_k = \{d_0, d_1, \ldots, d_k\}$.

Subsequently, the moving state (first moving state) estimated through the moving state estimating process is corrected using the constraint condition set in step A11 (step A13). The correction of the first moving state can be expressed by Expression 5 using the conditional probability density function of the moving state $x_k$ when the observation signal $Y_k$ and the constraint condition signal $D_k$ are given.

$$p(x_k \mid Y_k, D_k) = \frac{p(d_k \mid x_k) p(x_k \mid Y_k, D_{k-1})}{\int p(d_k \mid x_k) p(x_k \mid Y_k, D_{k-1}) dx_k} \quad (5)$$

When the moving state correcting process has been performed, the corrected moving state (first moving state) is calculated as a new moving state (second moving state) (step A15).

After performing the process of step A15 or A17, it is determined whether the calculation of the moving state should end (step A19). When it is determined that the calculation of the moving state should continue to be performed (NO in step A19), the process flow goes back to step A1. When it is determined that the calculation of the moving state should end (YES in step A19), the process flow of the calculation of the moving state ends.

1-2. Particulars

The processes performed in the steps of FIG. 1 will be described below in detail.

1-2-1. Moving State Estimating Process

In FIG. 1, the prediction and the correction of a moving state in the moving state estimating process of step A1 are expressed using the conditional probability density function of the moving state $x_k$. The moving state estimating process can be realized as a moving state estimating process using the Kalman filter by introducing Gaussian assumptions into Expression 3 representing the prediction of a moving state and Expression 4 representing the correction of a moving state.

The state equation in the Kalman filter can be expressed by Expression 6.

$$x_k = F_k x_{k-1} + w_k \quad (6)$$

In Expression 6, "$F_k$" represents a time-transition linear model of the moving state x. "$w_k$" represents the system noise and complies with the multivariable normal distribution of a covariance $Q_k$ and a zero average, that is, "$w_k \sim N(0, Q_k)$".

The observation equation in the Kalman filter is expressed by Expression 7.

$$y_k = H_k x_k + v_k \quad (7)$$

In Expression 7, "$H_k$" represents an observation model of linearly mapping the state space onto an observation space. "$v_k$" represents the noise of an observation value and complies with the multivariable normal distribution of a covariance Rk and a zero average, that is, "$v_k \sim N(0, Rk)$".

In the moving state estimating process using the Kalman filter, the prediction and the correction of the moving state x are performed on the basis of the state equation expressed by Expression 6 and the observation equation expressed by Expression 7. Since the operational equations related to the prediction and the correction of the Kalman filter are known in the related art, they will not be described herein.

1-2-2. Moving State Correcting Process

In the moving state correcting process, the first moving state is corrected using the constraint condition. In this exemplary embodiment, the constraint condition is described using the constraint equation expressed by Expression 8.

$$d_k = g_k(x_k) + \epsilon_k \quad (8)$$

In Expression 8, "$d_k$" represents the constraint condition definition value and "$g_k(\cdot)$" represents a model function (hereinafter, referred to as "constraint condition model function") for giving a constraint condition. "$\epsilon_k$" represents an error term of the constraint condition. In this exemplary embodiment, it is assumed that the error term "$\epsilon_k$" of the constraint condition complies with the multivariable normal distribution of a covariance $S_k$ and a zero average, that is, "$\epsilon_k \sim N(0, S_k)$".

The constraint condition model function $g_k(\cdot)$ is individually set depending on the type of the constraint condition to be set. A nonlinear function as well as a linear function can be applied as the constraint condition model function $g_k(\cdot)$. When a nonlinear function is set as the model function, it is difficult to perform calculation using the form of the model function without any change and thus the model function is linearized.

The moving state estimated in the moving state estimating process at time k is marked by "$x^+_k$". At this time, by Taylor developing the constraint condition model function $g_k(\cdot)$ up to the first-order term in the vicinity of the known moving state $x^+_k$, Expression 9 is obtained.

$$g_k(x_k) \approx g_k(x^+_k) + G_k(x_k - x^+_k) \quad (9)$$

provided that,

-continued $$G_k = \frac{\partial g_k(x_k)}{\partial x_k}\bigg|_{x_k=x_k^+}$$

Here, "$G_k$" represents a matrix (hereinafter, referred to as "constraint matrix") obtained by partial differentiating $g_k(x_k)$ with $x_k$.

Here, by substituting Expression 9 for Expression 8, Expression 10 is derived.

$$d_k \approx g_k(x_k^+) + G_k(x_k - x_k^+) + \varepsilon_k = G_k x_k + u_k + \varepsilon_k \quad (10)$$

provided that, $$u_k = g_k(x_k^+) - G_k x_k^+$$

Expression 10 has the same form as the state equation receiving an external input $u_k$ in the Kalman filter. Therefore, a correcting operational expression for correcting the moving state $x_k$ is derived from Expression 10 on the basis of the Kalman filter.

As a result, the correcting operational expressions shown in Expressions 11 to 13 are derived.

$$L_k = P_k^+ G_k^T (G_k P_k^+ G_k^T + S_k)^{-1} \quad (11)$$

$$x_k = x_k^+ + L_k(d_k - g_k(x_k^+)) \quad (12)$$

$$P_k = (I - L_k G_k) P_k^+ \quad (13)$$

Here, "$L_k$" represents a correction coefficient (gain) for correcting the moving state $x_k$ and "$P_k$" represents the error covariance of the moving state $x_k$. "I" represents a unit matrix. The superscript "+" means a value estimated through the moving state estimating process. That is, "$x_k^+$" means the moving state estimated through the moving state estimating process and "$P_k^+$" means the error covariance estimated through the moving state estimating process.

In step A13 of the moving state correcting process shown in FIG. 1, the first moving state estimated through the moving state estimating process of step A1 is corrected on the basis of the correcting operational expressions expressed by Expressions 11 to 13.

1-2-3. Setting of Constraint Condition

In this exemplary embodiment, conditions used to correct the first moving state to comply with the tendency of the state variation of the previously-calculated second moving state are set as the constraint condition. In order to correct the first moving state on the basis of Expressions 11 to 13, it is necessary to determine the constraint condition model function $g_k(x_k)$, the constraint condition definition value $d_k$, and the covariance $S_k$.

The constraint equation (Expression 8) representing the constraint condition is determined by the constraint condition model function $g_k(x_k)$ and constraint condition definition value $d_k$. The degree of adapting the first moving state estimated in the moving state estimating process to the tendency of the state variation of the previously-calculated second moving state is determined by the covariance $S_k$.

When the covariance $S_k$ increases, an action of lowering the degree of adapting the first moving state to the tendency of the state variation of the previously-calculated second moving state occurs. This is because when the covariance $S_k$ in Expression 11 gets close to "$+\infty$" ($S_k \to +\infty$), the correction coefficient $L_k$ gets close to "0". Then, Expression 12 is changed to "$x_k = x_k^+$". This means that the first moving state estimated in the moving state estimating process is maintained without any change and the action of the constraint condition is set to zero. On the contrary, When the covariance $S_k$ decreases, an action of raising the degree of adapting the first moving state to the tendency of the state variation of the previously-calculated second moving state occurs. That is, it is possible to enhance the action of the constraint condition to correct the moving state.

Accordingly, the covariance $S_k$ can be said to be a parameter representing the degree of adapting the first moving state estimated in the moving state estimating process to the tendency of the state variation of the previously-calculated second moving state. Therefore, the covariance $S_k$ is referred to as "adaptation parameter" in the following description.

A specific example of the constraint condition will be described below. The example illustrates the case in which the moving state $x_k$ is assumed as a velocity vector $v_k$ of a moving object (for example, automobile) and the constraint condition for the velocity vector $v_k$ is set. Since the velocity vector $v_k$ represents the velocity and the moving direction of the moving object, the velocity and the moving direction of the moving object is determined as the moving state $x_k$ in this example.

Figure 2A:
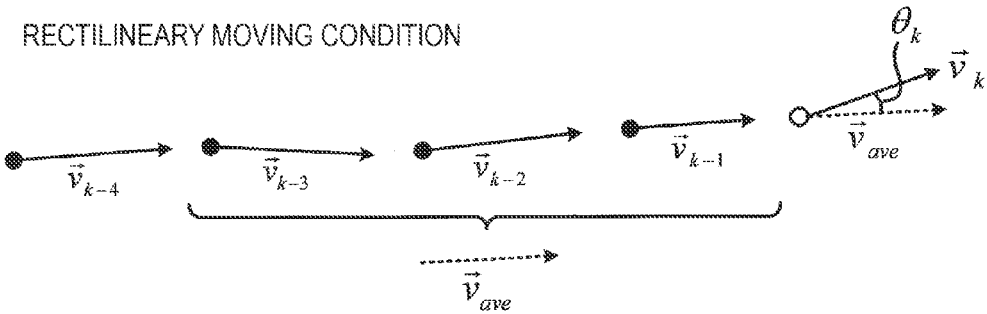
FIG. 2A is a diagram illustrating a rectilinear moving condition.
Figure 2B:
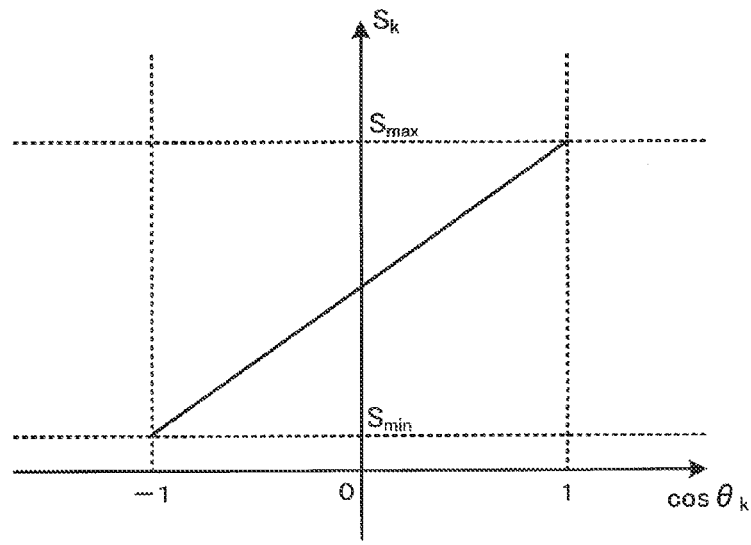
FIG. 2B is a diagram illustrating a method of setting an adaptation parameter.

FIGS. 2A and 2B are diagrams illustrating a rectilinear moving condition which is an example of the constraint condition. The rectilinear moving condition is a condition used to correct the first moving state so as to continue to rectilinearly move when the state variation of the previously-calculated second moving state indicates a rectilinear moving tendency. For example, when an automobile travels in a straight road (such as an expressway), the moving direction of the automobile is a rectilinear direction parallel to the traveling direction. Therefore, the velocity vector $v_k$ calculated as the moving state $x_k$ needs to represent a rectilinear moving tendency. As a result, a constraint on the moving direction is given so as to calculate the velocity vector $v_k$ indicating the rectilinear moving condition.

FIG. 2A schematically illustrates a velocity vector of an automobile at times k−4 to k. A velocity vector having a black circle at a start point represents a previously-calculated velocity vector. A velocity vector having a white circle at a start point represents a newest velocity vector estimated in the moving state estimating process.

A state is considered in which the velocity vector $v_k$ at time k is estimated through the moving state estimating process. At this time, for example, an average velocity vector $v_{ave}$ is calculated by averaging the velocity vectors corresponding to a predetermined period of time (for example, previous three time units) going back to the past from time k. A function of calculating an inner product of a unit vector $v_k/\|v_k\|$ of the velocity vector estimated at time k and a unit vector $v_{ave}/\|v_{ave}\|$ of the average velocity vector is set as the constraint condition model function $g_k(\cdot)$.

Specifically, for example, a constraint condition model function $g_k(v_k)$ expressed by Expression 14 is set.

$$g_k(\vec{v}_k) = \frac{\vec{v}_k}{\|\vec{v}_k\|} \cdot \frac{\vec{v}_{ave}}{\|\vec{v}_{ave}\|} = \frac{\|\vec{v}_k\|\|\vec{v}_{ave}\|\cos\theta_k}{\|\vec{v}_k\|\|\vec{v}_{ave}\|} = \cos\theta_k \quad (14)$$

Here, "$\theta_k$" represents an angle formed by the velocity vector $v_k$ and the average velocity vector $v_{ave}$.

In order to align the direction of the velocity vector $v_k$ and the direction of the average velocity vector $v_{ave}$ with each other, a constraint for setting the angle $\theta_k$ formed by the velocity vector $v_k$ and the average velocity vector $v_{ave}$ to 0 degree, that is, a constraint for setting the inner product calculated by Expression 14 to "1", can be given. Therefore, the constraint condition definition value $d_k$ in the constraint equation of Expression 8 is set to "1" ($d_k$=1).

FIG. 2B is a diagram illustrating a method of setting the adaptation parameter $S_k$ in this case. In FIG. 2B, the horizontal axis represents the inner product $\cos \theta_k$ calculated using Expression 14, and the vertical axis represents the set value of the adaptation parameter $S_k$. When the direction of the velocity vector $v_k$ and the direction of the average velocity vector $v_{ave}$ agree to each other, "$\cos \theta_k$=1" is obtained. In this case, it is not necessary to give any constraint on the velocity vector $v_k$. Therefore, in order to minimize the action of the constraint, the set value of the adaptation parameter $S_k$ is set to a given maximum definition value $S_{max}$.

On the contrary, when the direction of the velocity vector $v_k$ and the direction of the average velocity vector $v_{ave}$ are reverse, "$\cos \theta_k$=−1" is obtained. In this case, in order to align the direction of the velocity vector $v_k$ with the direction of the average velocity vector $v_{ave}$, it is necessary to maximize the strength of the constraint. Therefore, in order to maximize the action of the constraint, the set value of the adaptation parameter $S_k$ is set to a given minimum definition value $S_{min}$.

In a range of −1<$\cos \theta_k$<1", the action of the constraint can be made to decrease with a decrease in $\theta_k$. Accordingly, for example, as shown in FIG. 2B, the adaptation parameter $S_k$ is calculated depending on a linear increasing function connecting the minimum definition value $S_{min}$ and the maximum definition value $S_{max}$.

The function related to the calculation of the adaptation parameter $S_k$ in this case does not have to employ the function shown in FIG. 2B, but may employ, for example, a nonlinear increasing function.

In the method of setting the adaptation parameter $S_k$, the average velocity vector is determined using the previously-calculated velocity vectors, and the value of the adaptation parameter $S_k$ is calculated using the inner product of the average velocity vector and the estimated newest velocity vector. The inner product of vectors is equivalent to the angle formed by the vectors. Therefore, in the above-mentioned method, the direction of the average velocity vector is determined to be a reference moving direction and the adaptation parameter $S_k$ is calculated on the basis of the difference between the estimated newest moving direction and the reference moving direction.

In the above-mentioned example, the function of calculating the inner product of the average velocity vector $v_{ave}$ and the newest velocity vector $v_k$ is defined as the constraint condition model function, but a function of calculating an inner product of the estimated newest velocity vector $v_k$ and the previously-calculated velocity vector $v_{k-1}$ may be defined as the constraint condition model function.

Figure 3A:
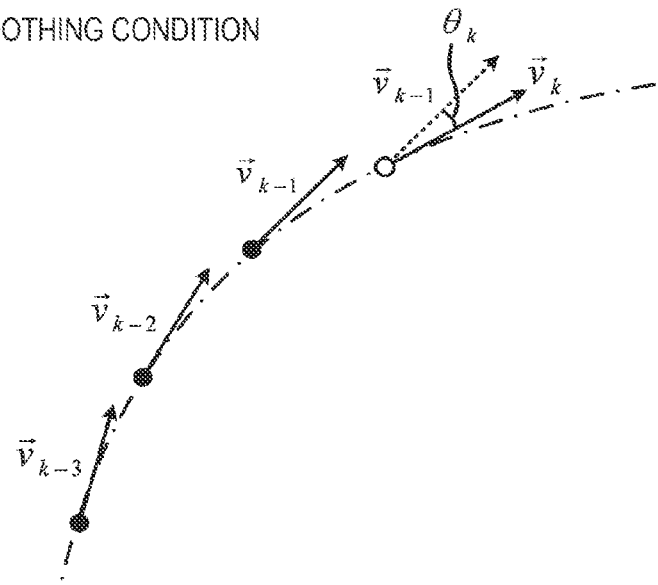
FIG. 3A is a diagram illustrating a smoothing condition.
Figure 3B:
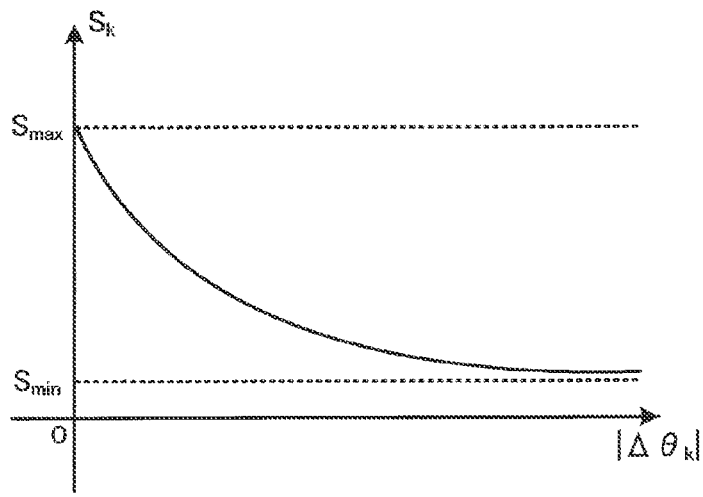
FIG. 3B is a diagram illustrating a method of setting an adaptation parameter.

FIGS. 3A and 3B are diagrams illustrating a smoothing condition which is another example of the constraint condition. The smoothing condition is a condition used to correct the first moving state so as to continue to turn when the state variation of the previously-calculated second moving state indicates a turning tendency. For example, when an automobile turns along a curve, the smoothing condition is a condition for giving a constraint on the velocity vector so as to calculate a velocity vector along the curved line of the curve.

FIG. 3A schematically illustrates the velocity vector of an automobile at times k−3 to k. The point of view of the drawing is the same as FIG. 2A. In the smoothing condition, a condition for making the angle θ formed by neighboring velocity vectors constant is given as the constraint condition to the velocity vectors acquired in time series.

The angle formed by the velocity vector $v_k$ at time k and the velocity vector $v_{k-1}$ at time k−1 is marked by $\theta_k$. The angle $\theta_k$ is calculated using the inner product and the outer product of the velocity vector $v_k$ and the velocity vector $v_{k-1}$. The magnitude of the angle $\theta_k$ is calculated using the inner product and the relative rotation direction of the neighboring velocity vectors is calculated using the outer product. The plus or minus sign of the angle $\theta_k$ varies depending on the relative rotation direction of the neighboring velocity vectors.

An average angle $\theta_{ave}$ is calculated by averaging the angles formed by the neighboring velocity vectors in a predetermined previous period of time (for example, previous three time units). A model function, which is expressed by Expression 15, for calculating an angle difference $\Delta\theta_k$ between the angle $\theta_k$ at time k and the average angle $\theta_{ave}$ is set as the constraint condition model function $g_k(\bullet)$.

$$g_k(\vec{v}_k) - \theta_k - \theta_{ave} = \Delta\theta_k \qquad (15)$$

In the smoothing condition, in order to make the angle formed by the neighboring velocity vectors constant, a constraint for setting the angle difference $\Delta\theta_k$ calculated by Expression 15 has only to be given. Therefore, the constraint condition definition value $d_k$ in the constraint equation of Expression 8 is set to "0" ($d_k$=0).

FIG. 3B is a diagram illustrating the method of setting the adaptation parameter $S_k$ in this case. In FIG. 3B, the horizontal axis represents the absolute value $|\Delta\theta_k|$ of the angle difference $\Delta\theta_k$ calculated by Expression 15 and the vertical axis represents the set value of the adaptation parameter $S_k$. As described above, in the smoothing condition, it is ideal that the angle difference $\Delta\theta_k$ is zero. Therefore, in order to minimize the action of the constraint, the set value of the adaptation parameter $S_k$ when "$\Delta\theta_k$=0" is set to the given maximum definition value $S_{max}$.

The set value of the adaptation parameter $S_k$ is made to decrease to enhance the action of the constraint as the value $|\Delta\theta_k|$ increases. Specifically, for example, as shown in FIG. 3B, the adaptation parameter $S_k$ is calculated on the basis of a nonlinear decreasing function getting closer to the given minimum definition value $S_{min}$ from the maximum definition value $S_{max}$ with the increase in $|\Delta\theta_k|$.

The function for calculating the adaptation parameter $S_k$ in this case does not have to employ the function shown in FIG. 3B, but may employ, for example, a linear decreasing function.

In the example, the function of calculating the angle difference between the newest angle $\theta_k$ and the average angle $\theta_{ave}$ in a predetermined period of time is defined as the constraint condition model function, a function of calculating an angle difference between the newest angle $\theta_k$ and the previously-calculated angle $\theta_{k-1}$ may be set as the constraint condition model function instead.

The rectilinear moving condition and the smoothing condition are examples of the constraint condition. These constraint conditions can be applied substantially in the same way when the position of $p_k$ of a moving object should be calculated as well as when the velocity vector $v_k$ of a moving object should be calculated. Since the variation in position per unit time corresponds to the velocity, the model function related to the rectilinear moving condition or the smoothing condition expressed by Expression 14 or 15 can be similarly formulated using a difference $p_k$−$p_{k-1}$ between position vectors instead of the velocity vector $v_k$. By using the model function formulated in this way, it is possible to perform an operation of correcting the position $p_k$ using the constraint condition with the position $p_k$ of a moving object as the state parameter.

2. Example

An example of a moving state calculating device will be described below. In this example, a position calculating device that calculates a position of a moving object using the position of the moving object as a state parameter will be described as an example of the moving state calculating device. Here, an example to which the invention can be applied is not limited to the following example.

2-1. Configuration

Figure 4:
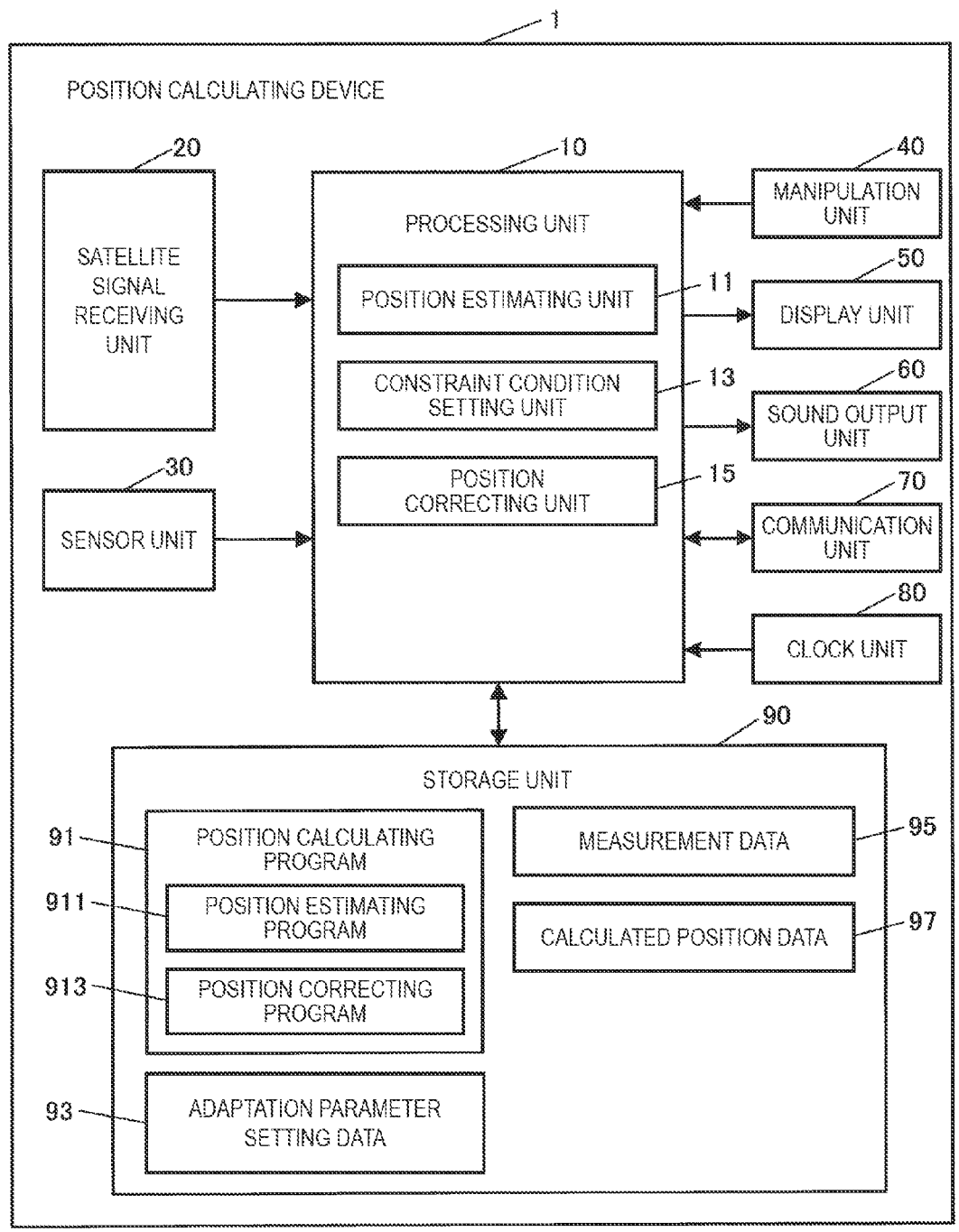
FIG. 4 is a diagram illustrating an example of a functional configuration of a position calculating device.

FIG. 4 is a block diagram illustrating an example of a functional configuration of a position calculating device 1 according to this example. The position calculating device 1 includes a processing unit 10, a satellite signal receiving unit 20, a sensor unit 30, a manipulation unit 40, a display unit 50, a sound output unit 60, a communication unit 70, a clock unit 80, and a storage unit 90.

The processing unit 10 is a processor comprehensively controlling the units of the position calculating device 1 in accordance with various programs such as a system program stored in the storage unit 90 and is constructed by a processor such as a central processing unit (CPU) or a digital signal processor (DSP).

In this example, the processing unit 10 includes a position estimating unit 11, a constraint condition setting unit 13, and a position correcting unit 15 as principal functional units. These functional units are only described as examples and the invention does not necessarily employ these functional units. Other functional units may be employed as essential constituents.

The position estimating unit 11 estimates a position of a moving object having the position calculating device 1 installed therein by performing a position estimating process, for example, the Kalman filter.

The constraint condition setting unit 13 sets a constraint condition for newly calculating a position using the position estimated by the position estimating unit 11 and a previously-calculated position.

The position correcting unit 15 calculates a new position by correcting the position estimated by the position estimating unit 11 using the constraint condition set by the constraint condition setting unit 13.

The satellite signal receiving unit 20 is a receiving device that receives GPS satellite signals transmitted from GPS satellites which are a kind of positioning satellites. The satellite signal receiving unit 20 captures GPS satellite signals by performing a signal process on RF (Radio Frequency) signals received via a GPS antenna not shown, and operates and acquires various quantities (hereinafter, referred to as "measurement information") on the captured GPS satellite signals. The measurement information includes quantities such as code phases or Doppler frequencies of the GPS satellite signals or quantities such as pseudo-distances or pseudo-distance variations between the position calculating device 1 and the GPS satellites. The satellite signal receiving unit 20 outputs the acquired measurement information to the processing unit 10.

The sensor unit 30 is a sensor unit including an inertia sensor such as an acceleration sensor or a gyro sensor. The sensor unit 30 outputs the detection result thereof to the processing unit 10.

The manipulation unit 40 is an input device including, for example, a touch panel or button switches and outputs the signal of a pressed key or button to the processing unit 10. Various instructions such as a position calculation request are input through the manipulation of the manipulation unit 40.

The display unit 50 is a display device including a liquid crystal display (LCD) and performs various displays based on display signals output from the processing unit 10. Position calculation results, time information, and the like are displayed on the display unit 50.

The sound output unit 60 is a sound output device including a speaker or the like and outputs various sounds based on sound output signals output from the processing unit 10. Voice or music associated with various applications is output from the sound output unit 60.

The clock unit 80 is an internal clock of the position calculating device 1 and includes a crystal oscillator having a quartz resonator and an oscillation circuit. The counted time of the clock unit 80 is output to the processing unit 10 from time to time.

The storage unit 90 includes a storage device such as a read only memory (ROM), a flash ROM, and a random access memory (RAM) and stores a system program for causing the processing unit 10 to control the position calculating device or various programs or data used to perform various application processes.

The storage unit 90 stores a position calculating program 91 which is read and performed as the position calculating process (see FIG. 5) by the processing unit 10. The position calculating program 91 includes a position estimating program 911 which is executed as the position estimating process and a position correcting program 913 which is executed as the position correcting process as sub routines.

The storage unit 90 also stores adaptation parameter setting data 93, measurement data 95, and calculated position data 97.

The adaptation parameter setting data 93 is data used to set the adaptation parameter $S_k$. For example, data for determining the function associated with the calculation of the adaptation parameter $S_k$ in the rectilinear moving condition shown in FIG. 2B and data for determining the function associated with the calculation of the adaptation parameter $S_k$ in the smoothing condition shown in FIG. 3B are included therein.

The measurement data 95 is data in which measurement information output from the satellite signal receiving unit 20 is stored. The measurement information is used to perform an operation of correcting a position in the position estimating process.

The calculated position data 97 is data in which the position calculated as the final calculated position by the position correcting unit 15 is stored.

2-2. Process Flow

Figure 5:
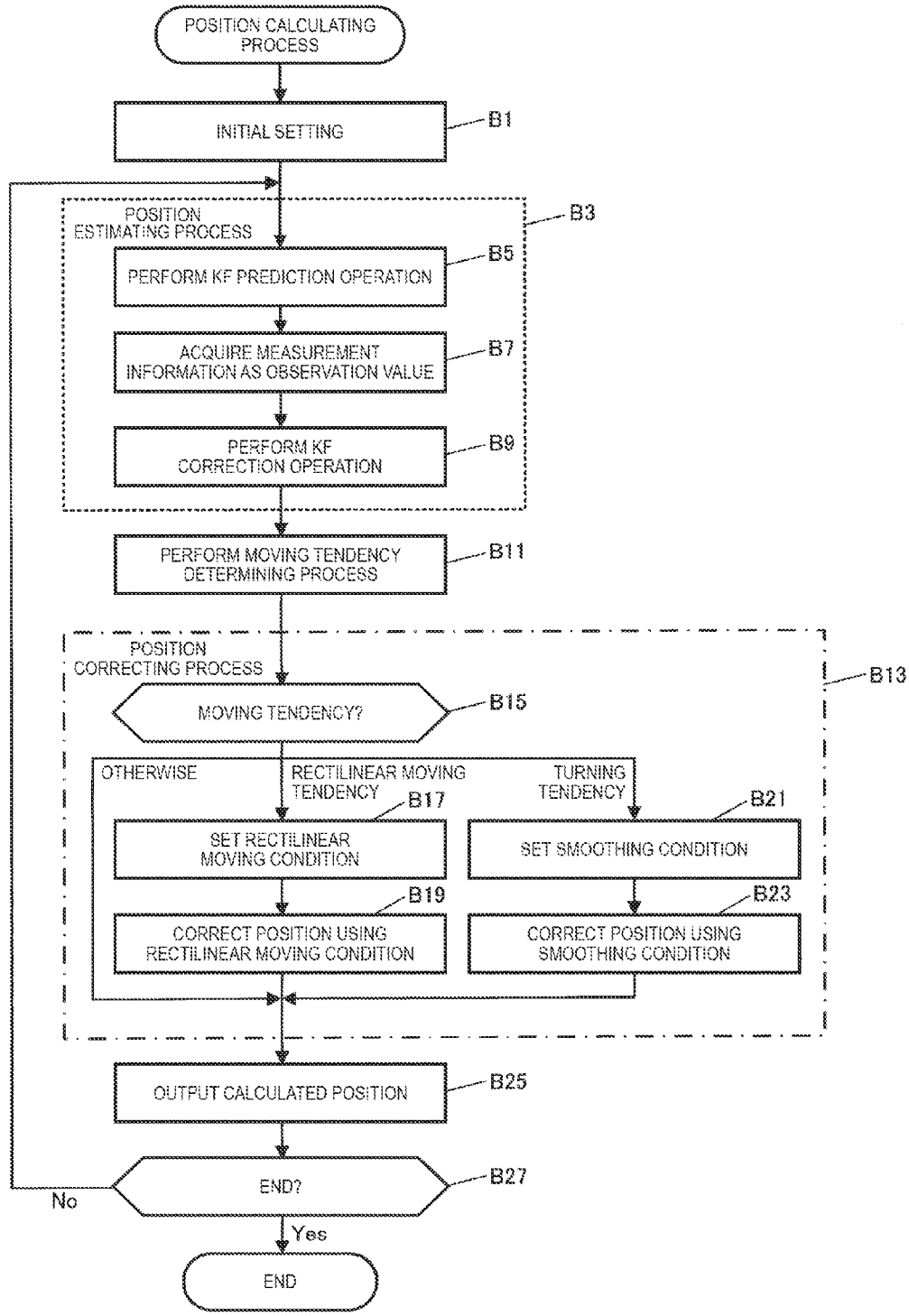
FIG. 5 is a flowchart illustrating a flow of a position calculating process.

FIG. 5 is a flowchart illustrating the flow of the position calculating process which is performed by the processing unit 10 in accordance with the position calculating program 91 stored in the storage unit 90. In this process, it is assumed that the capturing of the GPS satellite signals and the acquiring of the measurement information are frequently performed in the satellite signal receiving unit 20 and the measurement information can be frequently acquired by the processing unit 10.

First, the processing unit 10 performs an initial setting operation (step B1). Specifically, the position $p_k$ of the moving object is defined as a moving state $x_k$ ($x_k = p_k$) and a given initial position $p_0$ is set as the initial value $x_0$. For example, an approximate position of the position calculating device 1 can be set as the initial position $p_0$ by causing a user to input the approximate position using the manipulation unit 40.

Subsequently, the position estimating unit 11 performs the position estimating process in accordance with the position estimating program 911 stored in the storage unit 90 (step B3). In the position estimating process, the position estimating unit 11 performs a KF prediction operation (step B5). Specifically, a prediction operation of predicting a current position $p_k$ from the previous position $p_{k-1}$ is performed using a known prediction operational expression of the Kalman filter.

Thereafter, the position estimating unit 11 acquires measurement information (such as a code phase or a pseudo-distance) as an observation value from the satellite signal receiving unit 20 and stores the acquired measurement information in the measurement data 95 of the storage unit 90 (step B7).

Subsequently, the position estimating unit 11 performs a KF correction operation (step B9). Specifically, a correction operation of correcting the position $p_k$ predicted in step B5 on the basis of a known correction operational expression of the Kalman filter using the observation value acquired in step B7.

Thereafter, the processing unit 10 performs a moving tendency determining process (step B11). Specifically, it is determined whether the moving object has a rectilinear moving tendency, a turning tendency, or another tendency, for example, using an acceleration detected by the acceleration sensor or an angular velocity detected by the gyro sensor in the sensor unit 30.

Subsequently, the processing unit 10 performs the position correcting process in accordance with the position correcting program 913 stored in the storage unit 90 (step B13). In the position correcting process, the constraint condition setting unit 13 sets the constraint condition on the basis of the determination result of the moving tendency determining process (step B15).

That is, when it is determined that the moving tendency is the rectilinear moving tendency (rectilinear moving tendency in step B15), the constraint condition setting unit 13 sets the rectilinear moving condition (step B17). In the setting of the rectilinear moving condition, as described above, the constraint condition model function $g_k(\cdot)$ of Expression 14 is formulated using the position difference $p_k - p_{k-1}$ instead of the velocity vector $v_k$. The method of setting the constraint condition definition value $d_k$ or the adaptation parameter $S_k$ is the same as described with reference to FIGS. 2A and 2B.

Subsequently, the position correcting unit 15 corrects the position $p_k$ estimated in the position estimating process on the basis of Expressions 11 to 13 using the rectilinear moving condition set in step B17 (step B19).

When it is determined that the moving tendency is the turning tendency (turning tendency in step B15), the constraint condition setting unit 13 sets the smoothing condition (step B21). In the setting of the smoothing condition in this case, as described above, the angle $\theta_k$ of Expression 15 is determined using the position difference $p_k - p_{k-1}$ instead of the velocity vector $v_k$ and the constraint condition model function $g_k(\cdot)$ is formulated. The method of setting the constraint condition definition value $d_k$ and the adaptation parameter $S_k$ is the same as described with reference to FIGS. 3A and 3B.

Subsequently, the position correcting unit 15 corrects the position $p_k$ estimated in the position estimating process on the basis of Expressions 11 to 13 using the smoothing condition set in step B21 (step B23).

When it is determined that the moving tendency is neither the rectilinear moving tendency nor the turning tendency (otherwise in step B15), the position correcting unit 15 does not correct the position $p_k$ and the process proceeds to step B25.

Subsequently, the processing unit 10 outputs the calculated position (step B25). When the position $p_k$ is corrected using the constraint condition, the corrected position is output as the calculated position. When the position $p_k$ is not corrected using the constraint condition, the estimated position estimated in the position estimating process is output as the calculated position.

Then, the processing unit 10 determines whether the process flow should end (step B27), and the process returns to the process of step B3 again when it is determined that the process flow should not end (NO in step B27). When it is determined that the process flow should end (YES in step B27), the position calculating process ends.

2-3. Experiment Result

Figure 6A:
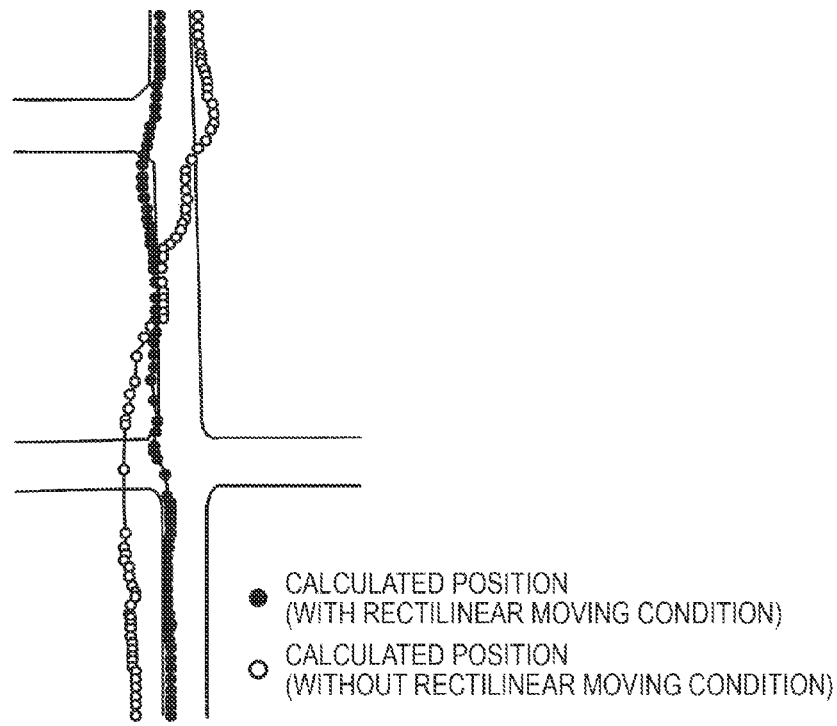
FIG. 6A is a diagram illustrating an example of a position calculation result when the rectilinear moving condition is employed.

FIGS. 6A and 7A are diagrams illustrating examples of the result of an experiment in which a position of a moving object is calculated using the position calculating device 1. FIG. 6A illustrates an example of the result of a position calculation experiment using the rectilinear moving condition and FIG. 6B illustrates an example of the result of a position calculation experiment using the smoothing condition.

In the experiment illustrated in FIG. 6A, an automobile having the position calculating device 1 installed therein caused to travel along a straight load and the positions calculated by the position calculating device 1 in this case are plotted in time series. The plot of black circles represents the calculated positions when the rectilinear moving condition is applied, and the plot of white circles represents the calculated positions when the rectilinear moving condition is not applied. From this experiment result, it can be seen that the calculated positions form a meandering trace when the rectilinear moving condition is not applied, but form a substantially linear trace along the road when the rectilinear moving condition is applied, thereby obtaining the calculated positions reflecting the rectilinear moving tendency.

Figure 6B:
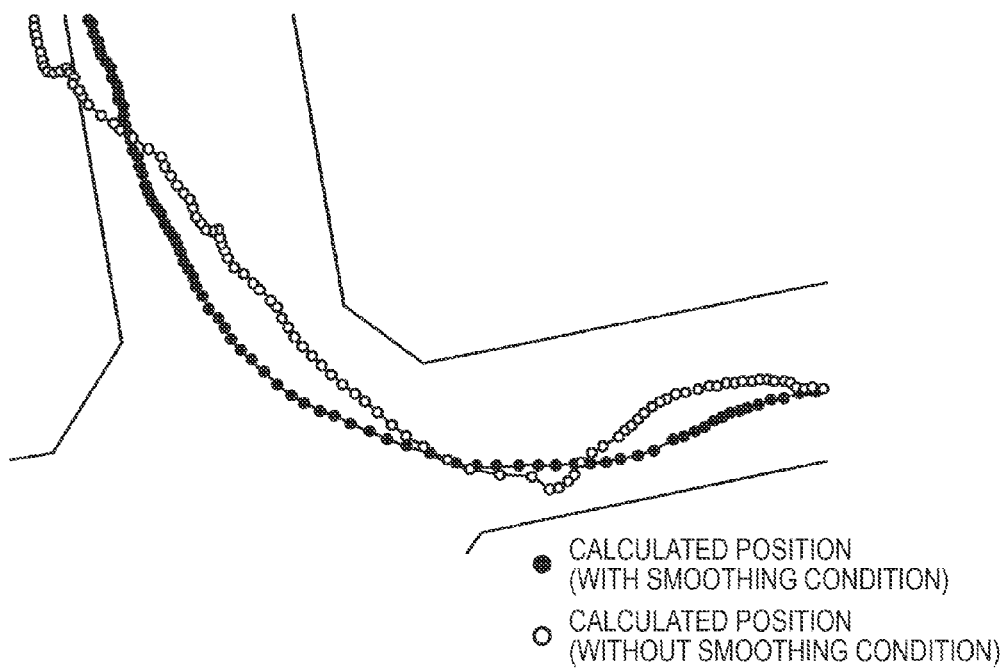
FIG. 6B is a diagram illustrating an example of a position calculation result when the smoothing condition is employed.

In the experiment illustrated in FIG. 6B, an automobile having the position calculating device 1 installed therein is caused to travel along a curved load and the positions calculated by the position calculating device 1 in this case are plotted in time series. The point of view of the drawing is the same as FIG. 6A. From this experiment result, it can be seen that the calculated positions do not form a smooth trace when the smoothing condition is not applied, but form a smoothing trace along the curved road when the smoothing condition is applied, thereby obtaining the calculated positions reflecting the turning tendency.

2-4. Operational Advantages

In the position calculating device 1, the position estimating unit 11 estimates the position of a moving object moving in a movement space. The constraint condition setting unit 13 sets the constraint condition for newly calculating the position of the moving object using the position of the moving object estimated by the position estimating unit 11 and the previously-calculated position of the moving object. The position correcting unit 15 calculates a new position by correcting the position using the constraint condition set by the constraint condition setting unit 13. The position estimating process can be implemented, for example, as an estimation process using the Kalman filter. It is possible to correctly calculate the position of the moving object by the use of the technique of calculating a new position by correcting the estimated position using a predetermined constraint condition instead of using the position estimated in the position estimating process as the final calculated position.

As the constraint condition, a condition used to correct the estimated position so as to comply with the tendency of the state variation of the previously-calculated position is set. For example, when the position variation of the previously-calculated position indicates the rectilinear moving condition, the condition (rectilinear moving condition) used to correct the position so as to continue to rectilinearly move is set as the constraint condition. When the position variation of the previously-calculated position indicates the turning tendency, the condition (smoothing condition) used to correct the position so as to continue to turn is set as the constraint condition. Accordingly, it is possible to calculate an appropriate position complying with the tendency of the state variation of the previously-calculated position.

3. Modification Examples

An example to which the invention can be applied is not limited to the above-mentioned example but can be appropriately modified without departing from the concept of the invention. Modification examples of the invention will be described below.

3-1. Moving State Estimating Process

The moving state estimating process is not limited to the estimation process using a known Kalman filter, but any process can be used as long as it uses a state estimating technique in a state space. For example, processes using filters such as an extended Kalman filter, an unscented Kalman filter, a particle filter, and an $H^\infty$ filter may be used.

3-2. Moving State

The component of the moving state to be calculated has only to include any of a position, a velocity, and a moving direction of a moving object. In this case, elements of the position, the velocity, and the moving direction may be used alone as the component of the moving state, or a combination of plural elements may be used as the component of the moving state.

An example of the position calculating device that calculates the position of a moving object using the position of the moving object as the component of the moving state is described in the above-mentioned example, but a velocity vector calculating device that calculates a velocity vector of a moving object using the velocity and the moving direction (that is, velocity vector) as the component of the moving state may be embodied.

3-3. Moving Object

The moving state calculating device can be installed in various moving objects. Specifically, the moving state calculating device may be installed in various moving objects such as a person, a bicycle, an automobile, a subway train, a ship, and an airplane to calculate the moving state.

3-4. Correction Operation

In the above-mentioned example, it is described that the moving tendency determining process of determining a moving tendency of a moving object is performed, the constraint condition based on the determination result is set, and the operation of correcting the moving state is performed. However, the moving tendency determining process may be skipped, plural types of constraint conditions may be set at the same time, and the operation of correcting the moving state may be performed.

In this case, matrices in which functions, definition values, and parameters of plural constraint conditions are packed together may be defined for the constraint condition model function $g_k(\bullet)$, the constraint condition definition value $d_k$, and the adaptation parameter $S_k$ which are set for each constraint condition, and the correction operation may be performed using the correcting operational expressions of Expressions 11 to 13.

Specifically, a matrix expressed by Expression 16 is set as a constraint condition model functional matrix $g_k(\bullet)$ including the model functions $g_k(\bullet)$ of plural constraint conditions.

$$g_k(x_k) = \begin{bmatrix} g_k^{(1)}(x_k) \\ g_k^{(2)}(x_k) \\ \vdots \end{bmatrix} \quad (16)$$

Here, the numeral written in a parenthesis of a superscript represents the number of a constraint condition. That is, $g^{(1)}_k(\bullet)$ represents the constraint condition model function of a first constraint condition (for example, rectilinear moving condition) and $g^{(2)}_k(\bullet)$ represents the constraint condition model function of a second constraint condition (for example, smoothing condition).

The matrix expressed by Expression 17 is set as the constraint condition definition value matrix including the constraint condition definition values $d_k$ of plural constraint conditions as components.

$$d_k = \begin{bmatrix} d_k^{(1)} \\ d_k^{(2)} \\ \vdots \end{bmatrix} \quad (17)$$

Here, $d^{(1)}_k$ represents the constraint condition definition value of the first constraint condition and $d^{(2)}_k$ represents the constraint condition definition value of the second constraint condition.

The matrix expressed by Expression 18 is set as the adaptation parameter matrix including the adaptation parameters $S_k$ of plural constraint conditions as components.

$$S_k = \begin{bmatrix} S_k^{(1)} & 0 & \cdots \\ 0 & S_k^{(2)} & \cdots \\ \vdots & \vdots & \ddots \end{bmatrix} \quad (18)$$

Here, $S^{(1)}_k$ represents the adaptation parameter of the first constraint condition and $S^{(2)}_k$ represents the adaptation parameter of the second constraint condition.

3-5. Types of Constraint Conditions

The rectilinear moving condition and the smoothing condition are exemplified as the constraint condition in the above-mentioned embodiment, but the constraint conditions are not limited to these conditions. For example, a constraint condition for setting the velocity vector (or the difference between position vectors) to zero may be set as the constraint condition when a moving object stops.

3-6. Determination of Moving Tendency of Moving Object

It is determined in the above-mentioned embodiment whether a moving object has the rectilinear moving tendency, or the turning tendency, or otherwise on the basis of the detection result of the sensor unit 30, but it may be determined whether a moving object has the rectilinear moving tendency, or the turning tendency, or otherwise on the basis of a variation in the previously-calculated position or the previously-calculated velocity without using the sensor unit 30.

3-7. Satellite Positioning System

In the above-mentioned embodiment, the GPS satellite signal receiver employing the GPS is exemplified as the satellite signal receiver of the position calculating device, but satellite signal receivers employing other satellite positioning systems such as WAAS (Wide Area Augmentation System), QZSS (Quasi Zenith Satellite System), GLONASS (GLObal NAvigation Satellite System), and GALILEO may be used.

What is claimed is:

1. A moving state calculating method for causing a processor to execute computer-readable instructions stored in a memory so as to calculate moving states of a moving object which moves along a curve,
the moving states include:
a first moving state that has at least one of a first position, a first velocity, and a first moving direction at a first current time and that is obtained by using at least one of a satellite signal from a satellite and an inertia output signal from an inertia sensor in the moving object without using constraint conditions;
a second moving state that has at least one of a second position, a second velocity, and a second moving direction at a second current time and that is obtained by using at least one of the satellite signal from the satellite and the inertia output signal from the inertia sensor and by using a first constraint condition of the constraint conditions; and
a third moving state that has at least one of a third position, a third velocity, and a third moving direction at a third current time and that is obtained by using at least one of the satellite signal from the satellite and the inertia output signal from the inertia sensor and by using a second constraint condition of the constraint conditions,
wherein the first current time is earlier than the second current time, and the second current time is earlier than the third current time, the method comprising:

estimating the first moving state by using at least one of the satellite signal from the satellite and the inertia output signal from the inertia sensor at the first current time;
setting a third constraint condition of the constraint conditions based on the first, second, and third moving states for obtaining a fourth moving state of the moving object; and
calculating the fourth moving state by correcting the first moving state with the third constraint condition,
wherein the setting includes:
obtaining a reference angular change based on an angular change based on the second and third moving states;
obtaining a latest angular change based on the first and third moving states; and
calculating a parameter corresponding to a moving path of the moving object that moves from the first moving state by the reference angular change, wherein when a difference between the reference angular change and the latest angular change is larger, the parameter is larger, and
the first moving state is corrected based on the parameter so that the first moving state is corrected in accordance with the moving path of the moving object that moves from the first moving state by the reference angular change.

2. A moving state calculating device that is configured to cause a processor to execute computer-readable instructions stored in a memory so as to calculate moving states of a moving object which moves along a curve,
the moving states include:
a first moving state that has at least one of a first position, a first velocity, and a first moving direction at a first current time and that is obtained by using at least one of a satellite signal from a satellite and an inertia output signal from an inertia sensor in the moving object without using constraint conditions;
a second moving state that has at least one of a second position, a second velocity, and a second moving direction at a second current time and that is obtained by using at least one of the satellite signal from the satellite and the inertia output signal from the inertia sensor and by using a first constraint condition of the constraint conditions; and
a third moving state that has at least one of a third position, a third velocity, and a third moving direction at a third current time and that is obtained by using at least one of the satellite signal from the satellite and the inertia output signal from the inertia sensor and by using a second constraint condition of the constraint conditions,
wherein the first current time is earlier than the second current time, and the second current time is earlier than the third current time, the moving state calculating device comprising:
the processor configured to:
estimate the first moving state by using at least one of the satellite signal from the satellite and the inertia output signal from the inertia sensor at the first current time;
set a third constraint condition of the constraint conditions based on the first, second, and third moving states for obtaining a fourth moving state of the moving object; and
calculate the fourth moving state by correcting the first moving state with the third constraint condition, wherein to set the third constraint condition, the processor further configured to:
  obtain a reference angular change based on an angular change based on the second and third moving states;
  obtain a latest angular change based on the first and third moving states; and
  calculate a parameter corresponding to a moving path of the moving object that moves from the first moving state by the reference angular change, wherein when a difference between the reference angular change and the latest angular change is larger, the parameter is larger, and
the first moving state is corrected based on the parameter so that the first moving state is corrected in accordance with the moving path of the moving object that moves from the first moving state by the reference angular change.

\* \* \* \* \*